(12) United States Patent
Katahira

(10) Patent No.: US 6,725,323 B2
(45) Date of Patent: Apr. 20, 2004

(54) APPARATUS AND METHOD FOR UPDATING FLASH ROM IN AN ELECTRONIC APPARATUS HAVING A PLURALITY OF BOARDS

(75) Inventor: Shunsuke Katahira, Hachioji (JP)

(73) Assignees: Kabushiki Kaisha Toshiba, Tokyo (JP); Toshiba Tec Kabushiki Kaisha, Tokyo (JP)

(*) Notice: Subject to any disclaimer, the term of this patent is extended or adjusted under 35 U.S.C. 154(b) by 174 days.

(21) Appl. No.: 10/003,253

(22) Filed: Dec. 6, 2001

(65) Prior Publication Data

US 2003/0110346 A1 Jun. 12, 2003

(51) Int. Cl.$^7$ .......................... G06F 13/00; G06F 9/445
(52) U.S. Cl. ........................... 711/103; 713/2; 717/168
(58) Field of Search .......................... 713/2; 717/168; 711/103

(56) References Cited

U.S. PATENT DOCUMENTS 5,317,723 A * 5/1994 Heap et al. ..................... 713/2
5,854,905 A * 12/1998 Garney ......................... 710/104
6,175,919 B1 * 1/2001 Ha ............................... 713/100
2002/0004870 A1 * 1/2002 Kobayashi ..................... 710/300
2002/0085229 A1 * 7/2002 Ikegami et al. ............... 358/1.16

FOREIGN PATENT DOCUMENTS

| JP | 9-114614 | 5/1997 |
| JP | 9-305394 | 11/1997 |
| JP | 10-283172 | 10/1998 |

* cited by examiner

Primary Examiner—Glenn Gossage
(74) Attorney, Agent, or Firm—Foley & Lardner

(57) ABSTRACT

An electronic apparatus and method for updating data in a flash read only memory (ROM) in an electronic apparatus. The electronic apparatus, which may be an image forming apparatus having copying and printing functions, has a first board connected to an external device, and a second board connected to the first board. If flash ROM-updating data received from the external device is not data used for updating the flash ROM on the first board, this updating data is forwarded to the second board. On the basis of the updating data forwarded from the first board, the flash ROM of the second board is updated. The updated data may be forwarded to a third board if the data is not data for updating the flash ROM on the second board.

2 Claims, 3 Drawing Sheets

APPARATUS AND METHOD FOR UPDATING FLASH ROM IN AN ELECTRONIC APPARATUS HAVING A PLURALITY OF BOARDS

BACKGROUND OF THE INVENTION

The present invention relates to an electronic apparatus such as an image forming apparatus having various functions, including a copy function and a network printer function, and also to a method of updating the data in a flash read only memory (ROM) provided in such an electronic apparatus.

A conventional electronic apparatus, such as an image forming apparatus, comprises a plurality of control boards. These boards are connected to other boards by way of interfaces. Data communication is enabled between the boards connected through the interfaces. A central processing unit (CPU) and a control program, which are used for executing control, and a nonvolatile memory, which stores control data, are provided on each of the control boards. The nonvolatile memory may be a ROM, which does not allow the rewriting of data, a flash ROM, which enables the electrical rewriting based on a predetermined program, or another type of memory. Where the data stored in the ROM (which does not allow the rewriting of data) must be updated, the ROM itself is replaced with another. This entails manual operations, such as detachment of the ROM from its board, disconnection of connectors and other devices arranged between the boards, etc.

Where the data stored in the flash ROM must be updated, a personal computer (PC) is connected to the board, and the data in the flash ROM is updated under the control of the PC. In this case as well, a manual operation is needed. The PC must be connected to the board holding the flash ROM whose data is to be updated. As described above, an electronic apparatus comprising a plurality of boards has problems in that the board holding the flash ROM whose data it to be updated must be first made connectable to a PC or another type of data-updating device, and then connected to the PC. If the data corresponding to a plurality of boards has to be updated, the operator has to connect the PC sequentially to the connection points of the boards. For this reason, the operation of updating the data in the flash ROM is troublesome.

BRIEF SUMMARY OF THE INVENTION

The present invention has been conceived to solve the problem that the operation of updating the data in flash ROMs is troublesome. Accordingly, the present invention is intended to provide an electronic apparatus that enables easy updating of data stored in nonvolatile memories even if the electronic apparatus comprises a plurality of boards. The present invention is also intended to provide a flash ROM data-updating method for use in the electronic apparatus.

An electronic apparatus according to the present invention comprises: a first board which has an external interface used for data communication to an external apparatus and which holds a first flash ROM that enables electrical rewriting of data; and at least one second board which is connected to the first board and which holds a second flash ROM that enables electrical rewriting of data, the first board including: a determination section which, upon reception of updating data of a control program from the external apparatus, determines if the updating data is data used for updating the first flash ROM; a first updating section which updates data in the first flash ROM based on the updating data when the determination section determines that the updating data is data used for updating the first flash ROM; and a transfer section which forwards the updating data to the at least one second board when the updating data is not data used for the updating the first flash ROM, the at least one second board including: a second updating section which, upon reception of the updating data forwarded from the first board, updates data stored in the at least one second flash ROM based on the updating data.

A flash ROM data-updating method according to the present invention is applicable to a control system of an electronic apparatus comprising a first board which has an external interface used for data communication to an external apparatus and which holds a first flash ROM that enables electrical rewriting of data; and at least one second board which is connected to the first board and which holds a second flash ROM that enables electrical rewriting of data, the method comprising: receiving updating data of a control program from the external apparatus and determining if the updating data in the first flash ROM is data used for updating the first flash ROM; updating data in the first flash ROM based on the updating data when the updating data is determined to be data used for updating the first flash ROM; forwarding the updating data to the at least one second board when the updating data is not determined to be data used for updating the first flash ROM; and updating data stored in the second flash ROM based on the updating data when the at least one second board receives the updating data forwarded from the first board.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate an embodiment of the invention, and together with the general description given above and the detailed description of the embodiment given below, serve to explain the principles of the invention.

DETAILED DESCRIPTION OF THE INVENTION

An embodiment of the present invention will now be described with reference to the accompanying drawings.

Figure 1:
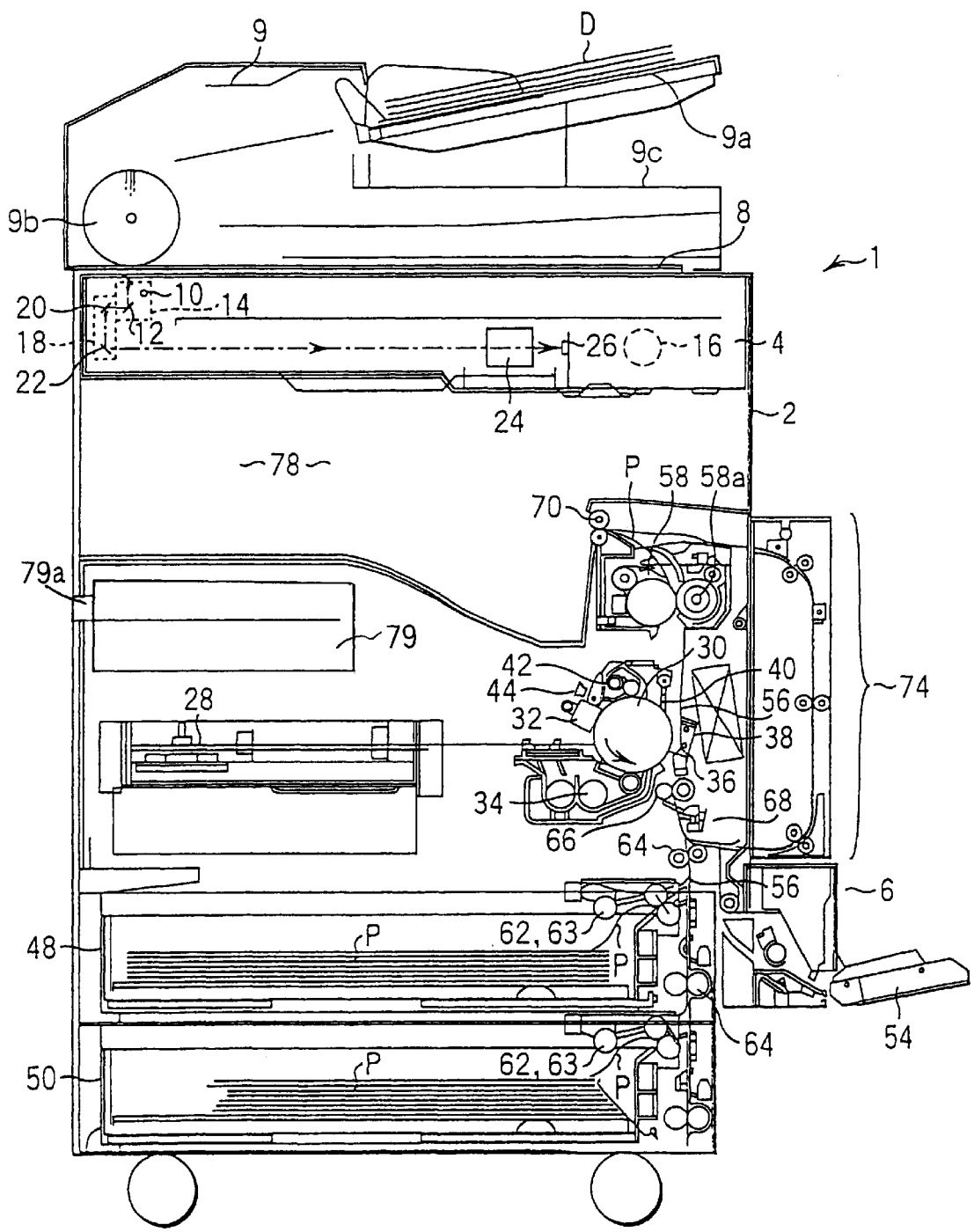
FIG. 1 is a sectional view showing a schematic structure of a digital copying machine, which is an example of an image forming apparatus or electronic apparatus according to the present invention.

FIG. 1 is a sectional view showing a schematic structure of a digital copying machine, which is an example of an image forming apparatus according to the present invention.

As shown in FIG. 1, the digital copying machine 1 comprises an apparatus main body 2, and this apparatus main body 2 contains a scanner section 4 serving as reading means, and a printer section 6 serving as image forming means.

A document table 8 made of transparent glass and designed to hold a document D (i.e., an object to be read) thereon is provided on top of the apparatus main body 2. An automatic document feeder (hereinafter referred to as "ADF") 9, which automatically feeds documents D to the document table 8, is also provided on top of the apparatus main body 2.

Documents D placed on the document tray 9a of the ADF 9 are fed by means of a feed guide (not shown) and are discharged onto a discharge tray 9c by means of a platen roller 9b. When the documents D are being carried by the platen roller 9b, they are exposed to light emitted from the exposure lamp 10 of the scanner section 4, which will be described later. By this operation, images on the documents D are read. The documents D are placed on the document tray 9a of the ADF 9 in such a manner that the surfaces to be read are directed upward. The documents D are fed into the apparatus one by one, and the uppermost document is taken in at all times.

The scanner section 4 arranged inside the apparatus main body 2 includes an exposure lamp 10 and a first mirror 12. The exposure lamp 10 is a light source that emits illumination light to a document when it is fed by the ADF 9 or placed on the document table 8. The exposure lamp 10 is a halogen lamp, for example. The first mirror 12 deflects the light reflected by the document so that the reflected light can travel in a predetermined direction. The exposure lamp 10 and the first mirror 12 are attached to a first carriage 14, which is located under the document table 8.

The first carriage 14 is movable in parallel to the document table 8. It is driven back and forth in the region under the document table 8 by a scanner motor (driving motor) 16 by means of a toothed belt (not shown), etc. The scanner motor 16 is a stepping motor, for example.

A second carriage 18, which is movable in parallel to the document table 8, is located under the document table 8. A second mirror 20 and a third mirror 22 are attached to the second carriage 18 in such a manner that they form an angle of 90°. The second and third mirrors 20 and 22 deflect the reflected light from the document in the order mentioned, after the first mirror 12 deflects the reflected light. The second carriage 18 receives a torque which is transmitted thereto from the scanner motor 16 by means of the toothed belt (by which the first carriage 14 is driven), for example. The second carriage 18 is driven in such a manner as to follow the first carriage 14, and moves in parallel to the document table 8 at a speed half that of the first carriage 14.

A focusing lens 24 and a charge coupled device (CCD) sensor 26 (line sensor) are arranged under the document table 8. The focusing lens 24 serves to focus the reflected light from the third mirror 20 provided on the second carriage 18. The CCD sensor 26 serves to receive the reflected light, which is converged by the focusing lens 24, and convert it into electric signals. The focusing lens 24 is arranged in the plane containing the optical axis of the light deflected by the third mirror 22, and is movable in that plane by means of a driving mechanism. The reflected light is focused at a desired power (in the main scan direction) in accordance with the movement of the focusing lens 24. The CCD sensor 26 executes photoelectric conversion with respect to the reflected light incident thereon in accordance with image processing clocks output by a main CPU, and outputs electric signals corresponding to a read document D. The power in the sub scan direction can be varied by changing the feeding speed of the ADF 9 or the moving speed of the first carriage 14.

When a document D fed by the ADF 9 is read, the irradiation position by the exposure lamp 10 is fixed at the position shown in FIG. 1. When a document D placed on the document table 8 is read, the irradiation position by the exposure lamp 10 is moved from left to right along the document table 8.

The printer section 6 is provided with a laser exposure unit 28, which serves as a latent image forming means. The circumferential surface of a photosensitive drum 30 is scanned with the laser beam emitted from the laser exposure unit 28, as a result of which an electrostatic latent image is formed on the circumferential surface of the photosensitive drum 30.

The printer section 6 is provided with the photosensitive drum 30 mentioned above. This drum 30 is a rotatable drum arranged substantially in the central right region of the apparatus main body 2 and serving as an image bearer. The circumferential surface of the photosensitive drum 30 is exposed to a laser beam emitted from the laser exposure unit 28, and a desired electrostatic latent image is formed thereby. Arranged around the photosensitive drum 30 are the following: a charger 32 which charges the circumferential surface of the drum to have a predetermined amount of charge; a developing unit (developing means) 34 which supplies toner (a developing agent) to the electrostatic latent image formed on the circumferential surface of the photosensitive drum 30 and thereby develops the image with a desired image density; and a separation charger 36 which separates image formation media (copy sheets) P from the photosensitive drum 30 (the image formation media are supplied from cassettes 48 and 50 to be described later). These three elements are integrally provided as one body. Also arranged around the photosensitive drum 30 are the following: a transfer charger 38 which transfers a toner image from the photosensitive drum 30 to a copy sheet P; a separation claw 40 which separates the copy sheet P from the circumferential surface of the photosensitive drum 30; a cleaning unit 42 which clears the circumferential surface of the photosensitive drum 30 of residual toner; and a discharger 44 which electrically discharges the circumferential surface of the photosensitive drum 30. These structural elements are arranged in the order mentioned.

An upper cassette 48 and a lower cassette 50 are arranged in the lower region of the apparatus main body 2. They are stacked one upon the other, and can be pulled out from the apparatus main body individually. The cassettes 48 and 50 contain copy sheets P that are different in size. A manual insertion tray 54 is provided on one side of the upper cassette 48.

A sheet feed path 56 is defined inside the apparatus main body 2. The sheet feed path 56 extends from the cassettes 48 and 50 and passes through a transfer region between the photosensitive drum 30 and the transfer charger 38. A fixing unit 58 including a fixing lamp 58a is provided at the terminating end of the sheet feed path 56. A discharge port 60 is located above the fixing unit 58.

In the neighborhood of each of the upper and lower cassettes 48 and 50, a sheet feed roller 62 and a separation roller 63 are provided. By means of these, the copy sheets P are taken out from the cassettes 48 and 50 one by one. A large number of sheet feed roller pairs 64 are provided in the sheet feed path 56 so that the copy sheets P picked up by the sheet feed roller 62 and separation roller 63 can be carried along the sheet feed path 56.

In the sheet feed path 56 and at a position upstream of the photosensitive drum 30, a register roller pair 66 is provided.

The register roller pair 66 serves to adjust the orientation of a picked-up copy sheet and registers the copy sheet in such a manner that the forward end of a toner image formed on the photosensitive drum 30 corresponds to the forward end of the sheet. Then, the copy sheet P is fed to a transfer section or region at the same speed as the moving speed of the circumferential surface of the photosensitive drum 30. A pre-alignment sensor 68 is provided at a position immediately before the register roller pair 66, i.e., at that side of the register roller pair 66 which is closer to the sheet feed roller pairs 64. The pre-alignment sensor 68 detects the arrival of the copy sheet P.

The copy sheets P, which are taken out from the cassettes 48 and 50 one by one, are first fed toward the register roller pair 66 by the sheet feed roller pairs 64. After the forward ends are registered, the copy sheets P are fed to the transfer region.

At the transfer region, the developer image formed on the photosensitive drum 30, namely a toner image, is transferred to a copy sheet P by the transfer charger 38. After the transfer of the toner image, the copy sheet P is separated from the circumferential surface of the photosensitive drum 30 by means of the separation charger 36 and the separation claw 40. Thereafter, the copy sheet P is fed to the fixing unit 58 by means of a feed belt (not shown), which constitutes part of the sheet feed path 56. After the fixing unit 58 melts and fixes the developer image to the copy sheet P, the copy sheet P is discharged through the discharge port 60 onto a sheet discharge tray 78, which is inside the apparatus main body 2, by means of a sheet discharge roller pair 70. An automatic reversing device 74 is provided to the right of the sheet feed path 56. By this automatic reversing device 74, a copy sheet P that has passed through the fixing unit 58 is reversed and fed back to the sheet feed path 56.

A controller (control system), which includes a plurality of control boards, is provided inside the apparatus main body 2. The controller is provided with a connection terminal which serves as an external interface and to which an external device, such as a PC, is connected. The connection terminal is located on the side or back surface of the apparatus main body 2, so that the external device can be easily connected to the apparatus main body 2. The connection terminal is an interface, such as RS 232C.

A control panel (not shown) is provided on the upper front portion of the apparatus main body 2. By operating the control panel, various copying conditions, such as a copying magnification, are entered, and a copying operation is started. The control panel comprises a liquid crystal display (LCD). This liquid crystal display shows operation guide messages and includes built-in touch keys that enable various designations.

Figure 2:
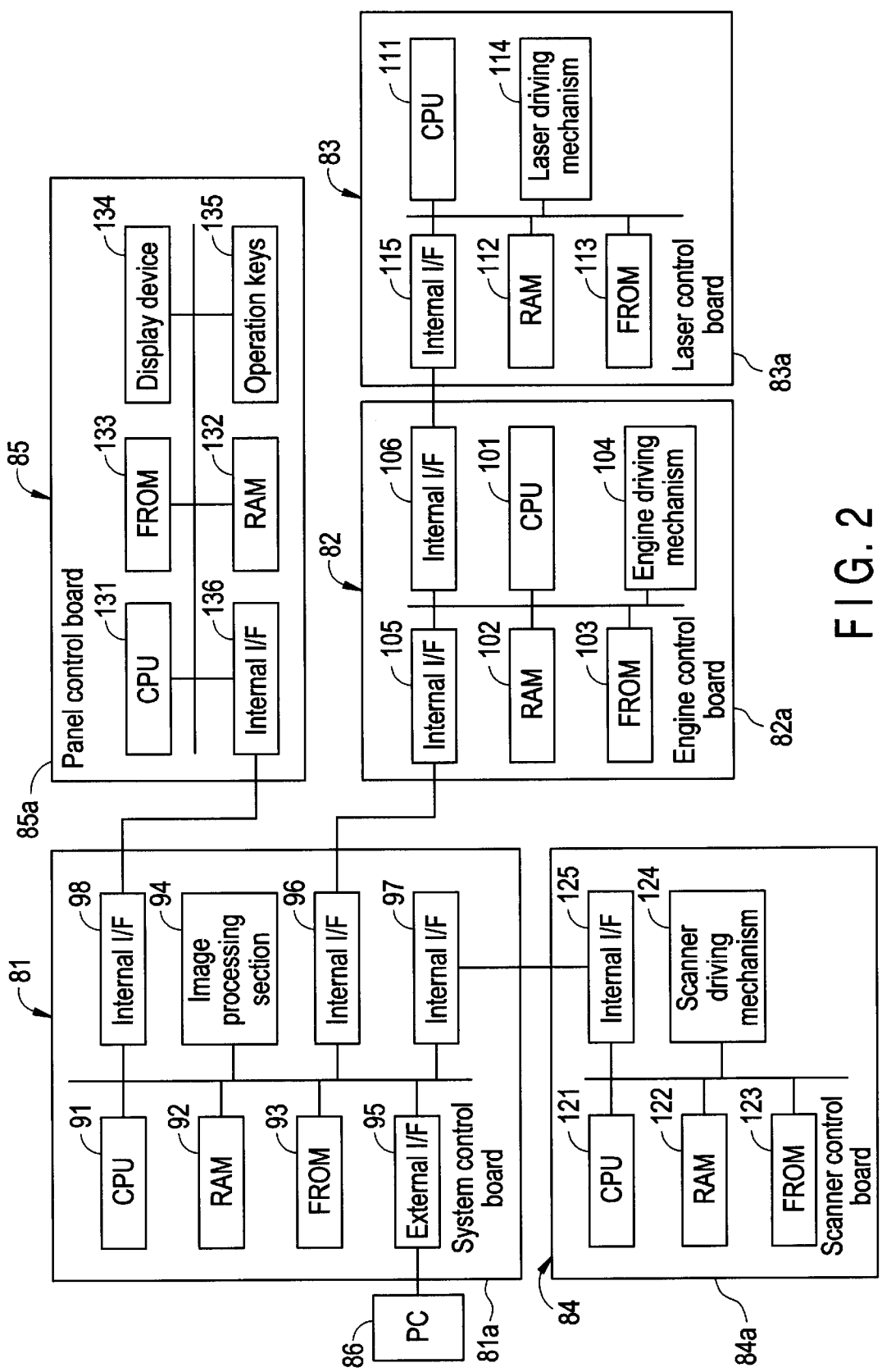
FIG. 2 is a block diagram illustrating the control system of the digital copying machine depicted in FIG. 1.

FIG. 2 is a block diagram illustrating the control system of the digital copying machine depicted in FIG. 1.

The control system of the digital copying machine 1 comprises a system control section 81, an engine control section 82, a laser control section 83, a scanner control section 84 and a panel control section 85. The system control section 81 is provided on a system control board 81a, the engine control section 82 is provided on an engine control board 82a, the laser control section 83 is provided on a laser control board 83a, the scanner control section 84 is provided on a scanner control board 84a, and the panel control section 85 is provided on a panel control board 85a. A CPU, a RAM and a flash ROM (FROM) are provided on each of these boards.

Let us assume that the system control board 81 is a parent board (first board) of the control system. In this case, the engine control board 82a, the scanner control board 84a and the panel control board 85a are child boards (second boards), and the laser control board 83a is a grandchild board (third board), as can be seen from FIG. 2. Therefore, when data is sent from the external device (such as PC 86 connected to the parent board) to the child boards, the data never fails to pass through the system control board 81a, namely the parent board. Likewise, when data is sent from the external device to the grandchild board 83a, the data never fails to pass through the parent board 81a and the child board 82a.

The system control section 81 performs overall control of the copying machine (system), image processing, recording of images, etc. The system control section 81 is provided on the system control board 81a. A CPU (system CPU) 91, a RAM 92, a flash ROM (FROM) 93, an image processing section 94, an external interface (external I/F) 95, internal interfaces (internal I/Fs) 96, 97 and 98, etc. are mounted on the system control board 81a.

The system CPU 91 performs control of the entire system. The RAM 92 is a volatile memory and temporarily stores data. The flash ROM 93 is a nonvolatile memory, the data in which can be rewritten based on a predetermined program. The flash ROM 93 stores a control program, control data, etc. The image processing section 94 performs image processing.

The external interface 95 is connected to the connection terminal described above. The external interface 95 is an interface that enables data communication with the external device, such as personal computer (PC) 86. When the copying machine is used as a network printer, a terminal device of the network is connected to the system control board 81a through the external interface 95. The external interface 95 may be provided independently of the system control board 81a.

Internal interface 96 is an interface that enables data communication with the engine control section 82. Internal interface 97 is an interface that enables data communication with the scanner control section 84. Internal interface 98 is an interface that enables data communication with the panel control section 85.

The engine control section 82 controls the main motor, feed rollers, etc., and prints images on image formation media. The engine control section 82 is provided on the engine control board 82a. A CPU 101, a RAM 102, a flash ROM (FROM) 103, an engine driving mechanism 104, internal interfaces (internal I/F) 105 and 106, etc. are mounted on the engine control board 82a.

The CPU 101 controls the printing of images on sheets in accordance with operation commands sent from the CPU 91 of the system controller 81. The RAM 102 is a volatile memory and temporarily stores data. The flash ROM 103 is a nonvolatile memory, the data in which can be rewritten based on a predetermined program. The flash ROM 103 stores a control program and control data, which are for engine control.

The engine driving mechanism 104 is a mechanism that drives the main motor of the printer section, etc. For example, the photosensitive drum 30, charger 32, developing unit 34, separation charger 36, transfer charger 38, cleaning unit 42, discharger 44, fixing unit 58, and automatic reversing device 74 are driven by the engine driving mechanism 104. In addition, the sheet feed rollers 62, separation roller 63, sheet feed roller pairs 64, register roller pair 66 and sheet discharge roller pair 70, which are located at respective positions of the sheet feed path 56 and constitute part of the feeding system, are also driven by the engine driving mechanism 104.

Internal interface 105 is an interface that enables data communication with the system control section 81. Through this interface 105, the engine control board 82b is connected to internal interface 96 of the system control board 81a. Internal interface 106 is an interface that enables data communication with the laser control section 83.

The laser control section 83 controls the emission of the semiconductor laser from the laser exposure unit 28. The laser control section 83 is provided on the laser control board 83a. A CPU 111, a RAM 112, a flash ROM (FROM) 113, a laser driving mechanism 114 and an internal interface (internal I/F) 115, etc. are mounted on the laser control board 83a.

The CPU 111 controls the laser exposure unit 28 in accordance with operation commands supplied from the CPU 111. The RAM 112 is a volatile memory and temporarily stores data. The flash ROM 113 is a nonvolatile memory, the data in which can be rewritten based on a predetermined program. The flash ROM 113 stores a control program and control data, which are for laser control.

The laser driving mechanism 114 causes the laser exposure unit 28 to emit a semiconductor laser and drives a polygon motor (not shown) etc. Internal interface 115 is an interface that enables data communication with the engine control section 82. Through this interface 115, the laser control board 83a is connected to the engine control board 82a.

The scanner control section 84 controls the document image-reading operation by the scanner control board 84a. The scanner control section 84 is provided on the scanner control board 84a. A CPU 121, a RAM 122, a flash ROM (FROM) 123, a scanner driving mechanism 124 and an internal interface (internal I/F) 125, etc. are mounted on the scanner control board 84a.

The CPU 121 controls the scanner section 4 in accordance with operation commands supplied from the CPU 91 of the system control section 81. The RAM 122 is a volatile memory and temporarily stores data. The flash ROM 123 is a nonvolatile memory, the data in which can be rewritten based on a predetermined program. The flash ROM 123 stores a control program and control data, which are for control of the scanner section.

The scanner driving mechanism 124 drives the scanner motor 16 to drive the first and second carriages of the scanner section 4. Internal interface 125 is an interface that enables data communication with the system control section 81. Through this interface 125, the scanner control board 84a is connected to the system control board 81a.

The panel control section 85 controls the control panel. The panel control section 85 is provided on the panel control board 85a. A CPU 131, a RAM 132, a flash ROM (FROM) 133, a display device 134, operation keys 135 and an internal interface (internal I/F) 136, etc. are mounted on the panel control board 85a.

The CPU 131 controls the control panel in accordance with operation commands supplied from the CPU 91 of the system control section 81. The RAM 132 is a volatile memory and temporarily stores data. The flash ROM 133 is a nonvolatile memory, the data in which can be rewritten based on a predetermined program. The flash ROM 133 stores a control program and control data used for controlling the control panel, as well as display data.

The display device 134 is a liquid crystal device including a built-in touch panel. The display device 134 displays setting contents, an operation state or operation guide messages. The operation keys are used by the user to enter operation commands. Internal interface 136 is an interface that enables data communication with the system control section 81. Through this interface 136, the panel control board 85a is connected to the system control board 81a.

Figure 3:
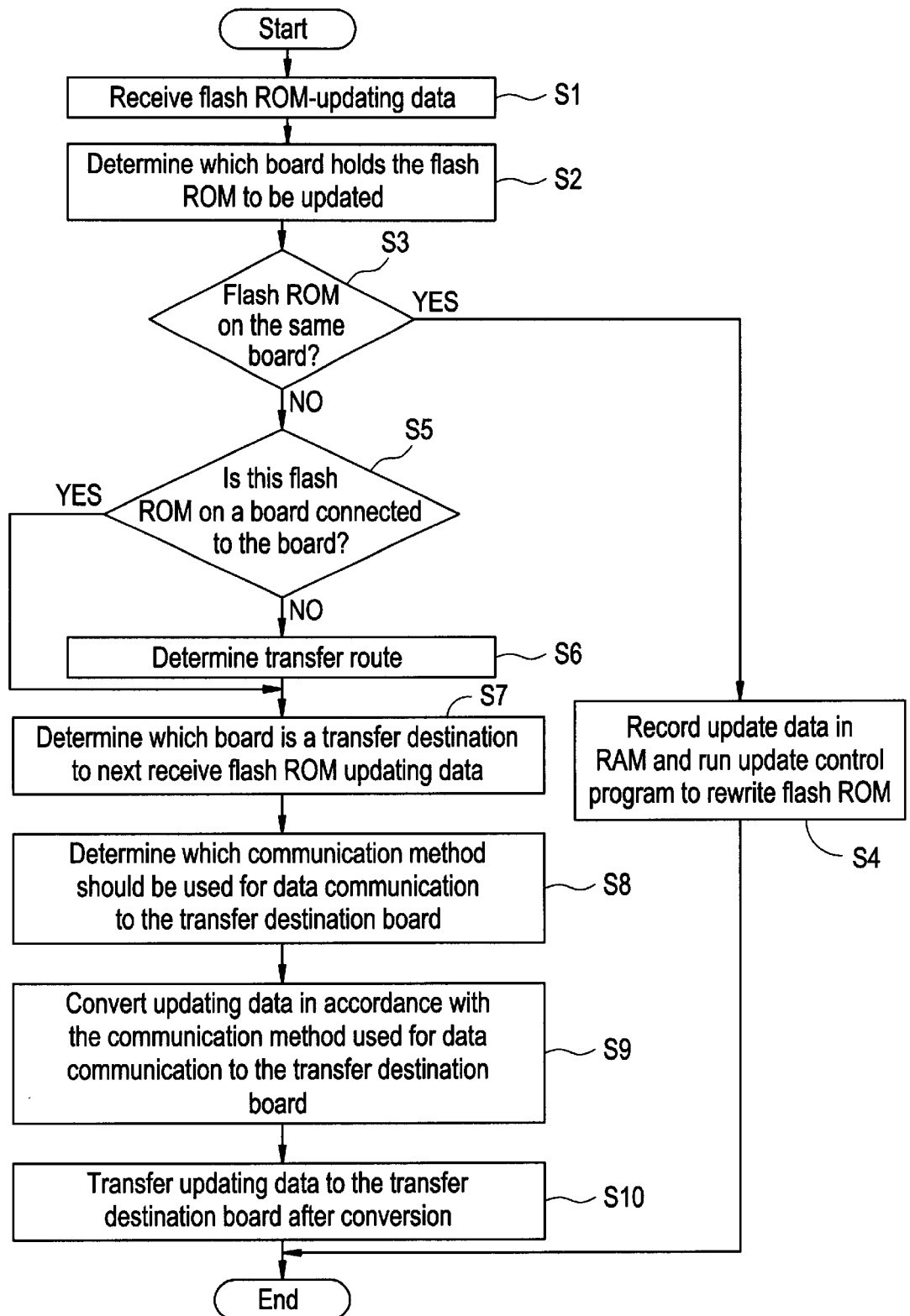
FIG. 3 is a flowchart illustrating how data is updated for a plurality of boards.

FIG. 3 shows a flowchart for explaining how the data in the flash ROM of each board is updated. In the description below, it is assumed that PC 86 connected to the external interface 95 of the system control board 81a sends updating data to the copying machine.

First of all, the operator connects PC 86 to the connection terminal by means of a communication cable or the like. After PC 86 is connected to the connection terminal, the operator operates PC 86 to transmit the updating data to the copying machine. The updating data includes information designating a flash ROM to be updated, an updating control program for updating processing, updating data, etc. PC 86 may be connected beforehand as a network terminal.

When PC 86 transmits the flash ROM-updating data, this data is received by the external interface 95 of the system control section 81 (Step S1). Upon reception of the updating data, the CPU 91 of the system control section 81 checks the updating data and determines which board holds the flash ROM to be updated (Step S2). By this determination, the board that holds the flash ROM to be updated is identified. Then, CPU 91 determines whether the flash ROM to be updated is the one held on the same board as CPU 91, i.e., whether the flash ROM to be updated is the one held on the system control board 81a (Step S3).

If this determination shows that the flash ROM to be updated is the one held on the same board, i.e., if it is flash ROM 93 (Step S3, YES), CPU 91 records the updating data in RAM 92 and runs the updating control program in RAM 92. By running this updating control program, CPU 91 rewrites the data in flash ROM 93 on the basis of the updating data (Step S4). As a result, the updating processing of the flash ROM is completed on the basis of the updating data.

If the determination described above does not show that the flash ROM to be updated is the one held on the same board (Step S3, NO), CPU 91 determines whether or not the board holding the flash ROM to be updated (determined in Step S2) is connected to the system control board 81a (Step S5).

If this determination shows that the board holding the flash ROM to be updated is connected to the system control board 81a (Step S5, YES), CPU 91 determines which board is a transfer destination, i.e., which board is the board to which the updating data should be sent to (Step S7).

If the determination described above does not show that the board holding the flash ROM to be updated is connected to the system control board 81a (Step S5, NO), CPU 91 determines a transfer route along which the updating data is sent to the flash ROM to be updated (Step S6). On the basis of the transfer route determined in this manner, CPU 91 determines which board should receive updating data (Step S7).

In other words, the laser control board 83a holding the flash ROM 113 is not connected to the system control board 81a described above. Therefore, if the flash ROM to be updated is flash ROM 113, CPU 91 determines that the updating data should be sent to the laser control board 83a along the route that extends from the system control board 81a to the laser control board 83a by way of the engine control board 82a. On the basis of this transfer route determination, CPU 91 determines that the updating data should be sent to the engine control board 82a.

In the case where the board holding the flash ROM to be updated is connected to the board that has received the updating data, the CPU of the board that has received the updating data determines that the board holding the flash ROM to be updated is the transfer destination of the updating data.

In the case where the board holding the flash ROM to be updated is not connected to the board that has received the updating data, the CPU of the board that has received the updating data determines which transfer route should be used for sending the updating data to the board holding the flash ROM to be updated. On the basis of the transfer route, the CPU of the board that has received the updating data identifies the transfer destination board to which the updating data should be sent.

After identifying the transfer destination board to which the updating data is sent, CPU 91 checks which communication method the internal interfaces should use for sending the data to the transfer destination board (Step S8). The communication methods available include serial communication, parallel data communication, peripheral component interconnect (PCI) communication, etc. After determining the communication method used for sending the data to the transfer destination board, CPU 91 converts the format of the updating data in accordance with the determined communication method (Step S9). After this conversion process, in which the updating data is converted such that it has a format enabling the data transfer operation, CPU 91 sends or transfers the converted data to the transfer destination board (Step S10).

In the manner described above, the system control board 81a that has received the updating data completes its operations.

In the above description, reference was made to the case where the system control board 81a receives flash ROM-updating data from PC 86, which is an external device. Similar operations are executed in the case where another control board receives flash ROM-updating data from another control board. For example, when each control board receives updating data from the system control board 81a or another control board, processing similar to that defined in steps S1 to S10 is executed, so as to update the flash ROM or send the updating data to another board.

As described above, an apparatus comprises a plurality of boards, and if a board receives updating data which should be transferred to another board, internal interfaces provided beforehand enable that updating data to be transferred to the other board.

By virtue of this, a PC or another device that sends updating data need not be connected to each of the boards, and yet the flash ROM mounted on each board can be updated. Hence, the trouble of manual data updating can be greatly saved.

The data updating method described above is applicable to an apparatus wherein a plurality of boards are combined in a complex manner. Data updating for all boards can be executed by merely sending updating data from a PC or another type of device connectable to one of the boards.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A flash ROM data-updating method applicable to an electronic apparatus comprising: a first board which is connected to an external interface used for data communication with an external apparatus and which holds a first flash ROM that enables electrical rewriting of data, a plurality of second boards each of which is connected to the first board and each of which holds a second flash ROM that enables electrical rewriting of data; and at least one third board which is connected to a particular one of the second boards and which holds a third flash ROM that enables electrical rewriting of data, the method comprising:

receiving, by the first board, flash ROM-updating data from the external device, determining whether or not the received updating data is data used for updating the first flash ROM;

performing updating of data in the first flash ROM based on the received updating data, when the received updating data is determined to be data used for updating the first flash ROM;

determining whether the received updating data is one of updating data for one of the second flash ROMs and updating data for the third flash ROM, when the received updating data is not determined to be the data used for updating the first flash ROM;

determining a transfer path for forwarding the received updating data from the first board to the third board via the particular one of the second boards, when the received updating data is determined to be data used for updating the third flash ROM of the third board;

forwarding the received updating data from the first board to one of the second boards, which is one of: (i) one of the second boards having a second flash ROM whose data should be updated with the received updating data; and (ii) the particular one of the second boards identified based on the transfer path;

performing updating of data in the second flash ROM based on updating data the one of the second boards receives from the first board, when the received updating data is determined to be data used for updating the second flash ROM, forwarding updating data the particular one of the second boards receives from the first board, from the particular one of the second boards to the third board having the third flash ROM whose data should be updated with the received updating data, when the received updating data is determined to be the data used for updating the third flash ROM; and performing updating of data in the third flash ROM based on updating data the third board receives from the particular one of the second boards, when the received updating data is determined to be the data used for updating the third flash ROM.

2. The method according to claim 1, wherein:

forwarding updating data from the first board to the particular one of the second boards and from the particular one of the second boards to the third board determines a communication method of a transfer destination board to which the updating data is forwarded; and the updating data is forwarded to the transfer destination board after a format of the updating data is converted in accordance with the determined communication method.

* * * * *